United States Patent
Matsumoto (10) Patent No.: US 11,245,414 B2
(45) Date of Patent: Feb. 8, 2022

(54) DELTA-SIGMA MODULATOR AND METHOD OF DRIVING DELTA-SIGMA MODULATOR

(71) Applicant: Sony Semiconductor Solutions Corporation, Kanagawa (JP)

(72) Inventor: Takashi Matsumoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/267,944

(22) PCT Filed: Sep. 13, 2019

(86) PCT No.: PCT/JP2019/036012
§ 371 (c)(1),
(2) Date: Feb. 11, 2021

(87) PCT Pub. No.: WO2020/054830
PCT Pub. Date: Mar. 19, 2020

(65) Prior Publication Data
US 2021/0203351 A1 Jul. 1, 2021

(30) Foreign Application Priority Data
Sep. 14, 2018 (JP) .............................. JP2018-172034

(51) Int. Cl.
*H03M 3/00* (2006.01)
*H03M 1/06* (2006.01)
*H03M 1/74* (2006.01)

(52) U.S. Cl.
CPC ......... *H03M 3/464* (2013.01); *H03M 1/0626* (2013.01); *H03M 1/747* (2013.01)

(58) Field of Classification Search
CPC .... H03M 3/464; H03M 1/0626; H03M 1/747; H03M 3/43; H03M 3/444
(Continued)

(56) References Cited

U.S. PATENT DOCUMENTS

| 7,075,475 B1 * | 7/2006 | Wan ...................... H03M 3/342 341/143 |
| 10,128,866 B2 * | 11/2018 | Tkachev ............... H03M 3/462 |
| 2013/0169460 A1 | 7/2013 | Obata et al. |

FOREIGN PATENT DOCUMENTS

| WO | 2012/032690 A1 | 3/2012 |
| WO | 2018/163679 A1 | 9/2018 |

OTHER PUBLICATIONS

International Search Report (PCT/ISA/210), International Application No. PCT/JP2019/036012, dated Oct. 4, 2019.
(Continued)

*Primary Examiner* — Khai M Nguyen
(74) *Attorney, Agent, or Firm* — Michael Best & Friedrich LLP (57) ABSTRACT

Instability of an internal state in a current-input-type delta-sigma modulator is reduced in a case where input changes sharply.
A signal current is input to a first integration node. A difference current between a fixed current and the signal current is input to a second integration node. A voltage-to-current converter that converts a difference voltage between the voltage of the first integration node and a first reference voltage into a current and outputs it is connected between the first integration node and the second integration node. The voltage of the second integration node is compared with a second reference voltage, and a 1-bit digital signal is output. Current is draws from the first integration node or the second integration node according to the 1-bit digital signal. A short-circuit switch is provided between the first integration node and the second integration node for short-circuiting them.

6 Claims, 9 Drawing Sheets

(58) Field of Classification Search
USPC .................................................. 341/143, 155
See application file for complete search history.

(56) References Cited

OTHER PUBLICATIONS

Notification of Transmittal of the International Search Report and the Written Opinion of the International Searching Authority, or the Declaration (PCT/ISA/220), International Application No. PCT/JP2019/036012, dated Oct. 15, 2019.

* cited by examiner

FIG. 8

DELTA-SIGMA MODULATOR AND METHOD OF DRIVING DELTA-SIGMA MODULATOR

TECHNICAL FIELD

The present technology relates to a delta-sigma modulator and a method of driving the delta-sigma modulator, and more particularly, relates to a current-input-type delta-sigma modulator and the like.

BACKGROUND ART

A delta-sigma modulator is used as one of analog-digital (AD) converters (see, for example, Patent Document 1).

CITATION LIST

Patent Document

Patent Document Japanese Patent Application Laid-Open No. 2010-263483

SUMMARY OF THE INVENTION

Problems to be Solved by the Invention

In a case where input to a current-input-type delta-sigma modulator changes sharply, the internal state becomes unstable. It is desired to reduce such instability of the internal state to speed up the settling of output to shorten AD conversion time.

It is an object of the present technology to reduce instability of an internal state in a current-input-type delta sigma modulator in a case where input changes sharply.

Solutions to Problems

A concept of the present technology is in
a delta-sigma modulator including:
a first integration node to which a signal current is input;
a second integration node to which a difference current between a fixed current and the signal current is input;
a voltage-to-current converter that is connected between the first integration node and the second integration node, and converts a difference voltage between a voltage of the first integration node and a first reference voltage into a current and outputs the current;
a 1-bit AD converter that compares a voltage of the second integration node with a second reference voltage and outputs a 1-bit digital signal;
a feedback DA converter that draws current from the first integration node or the second integration node according to an output of the 1-bit AD converter; and
a short-circuit switch that short-circuits the first integration node and the second integration node.

In the present technology, the delta-sigma modulator includes the first integration node, the second integration node, the voltage-to-current converter, the 1-bit AD converter, and the feedback DA converter. A signal current is input to the first integration node. A difference current between the fixed current and the signal current is input to the second integration node. The voltage-to-current converter is connected between the first integration node and the second integration node. In the voltage-to-current converter, a difference voltage between the voltage of the first integration node and the first reference voltage is converted into a current and output.

In the 1-bit AD converter, the voltage of the second integration node is compared with the second reference voltage, and a 1-bit digital signal is output. In the feedback DA converter, current is drawn from the first integration node or the second integration node according to an output of the 1-bit AD converter.

In the present technology, the delta-sigma modulator further includes the short-circuit switch for short-circuiting the first integration node and the second integration node. For example, the short-circuit switch is turned on at a timing when the first integration node and the second integration node can be out of a balanced state. In this case, for example, the timing may be a timing at which the signal current changes sharply, for example, a timing at which the signal current system is changed. Further, for example, the timing may be a timing at which the fixed current becomes unstable.

As described above, the present technology includes the short-circuit switch for short-circuiting the first integration node and the second integration node. Thus, in a case where input changes sharply, by turning on the short-circuit switch, instability of the internal state can be reduced, so that the settling of output can be speeded up, and AD conversion time can be shortened.

MODE FOR CARRYING OUT THE INVENTION

Hereinafter, a mode for carrying out the invention (hereinafter referred to as an "embodiment") will be described. Note that the description will be made in the following order.
1. Embodiment
2. Modification

1. Embodiment

Figure 1:
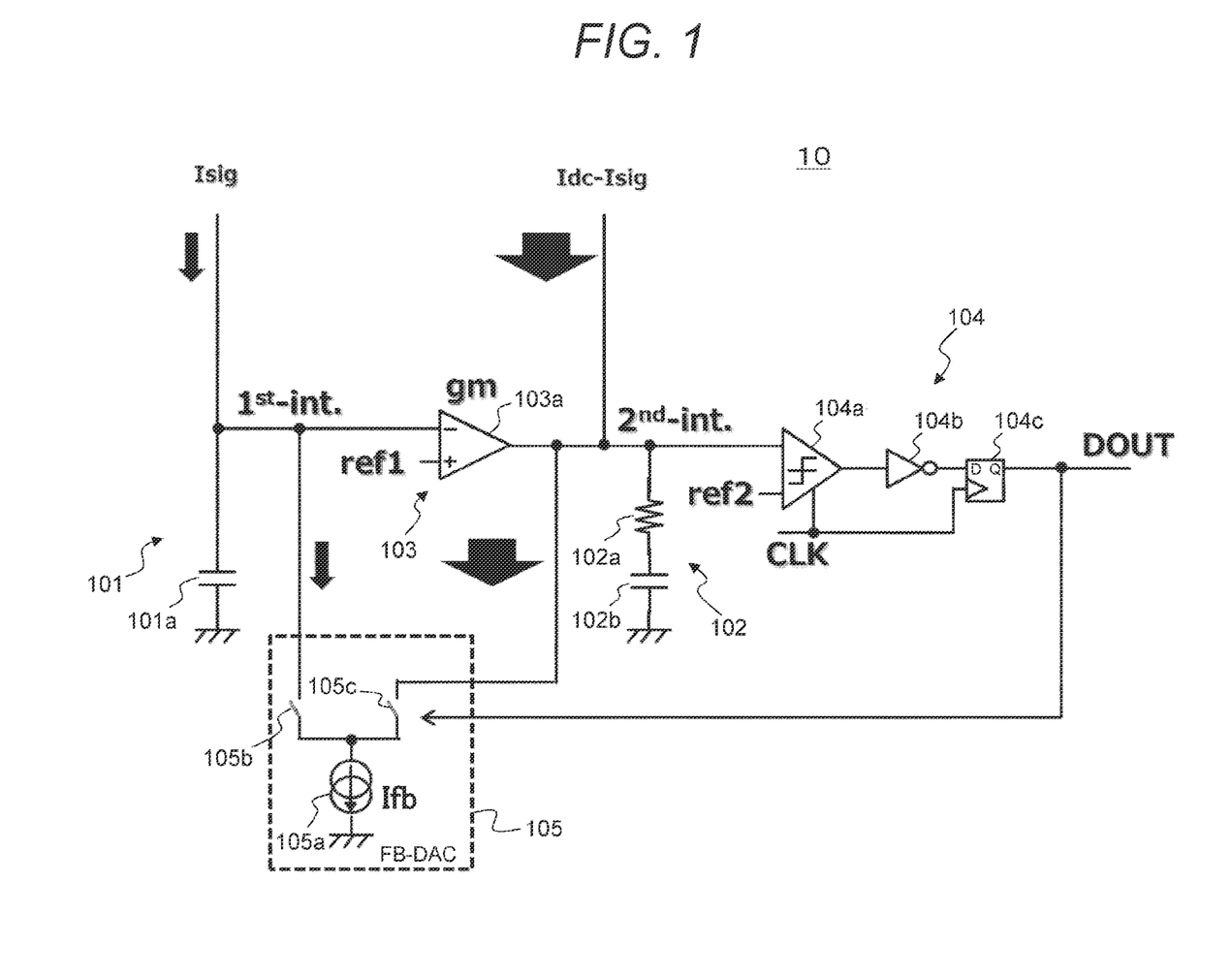
FIG. 1 is a diagram showing a configuration example of a current-input-type delta-sigma modulator.

[Delta-Sigma Modulator]
FIG. 1 shows a configuration example of a current-input-type delta-sigma modulator 10. The delta-sigma modulator 10 includes a first integration node 101, a second integration node 102, a voltage-to-current converter 103, a 1-bit AD converter 104, and a feedback DA converter 105.

The first integration node 101 includes an integrator including a capacitor 101a. A signal current Isig is input to the first integration node 101. The second integration node 102 includes an integrator including a series circuit of a resistor 102a and a capacitor 102b. A difference current (Idc-Isig) between a fixed current Idc and the signal current Isig is input to the second integration node 102.

The voltage-to-current converter 103 is connected between the first integration node 101 and the second integration node 102. The voltage-to-current converter 103 includes an operational amplifier 103a. In this case, the first integration node 101 is connected to an inverting input terminal, a first reference voltage ref1 is applied to a non-inverting input terminal, and an output terminal is connected to the second integration node 102. In the voltage-to-current converter 103, a difference voltage (ref1-1st-int.) between a voltage 1st-int. of the first integration node 101 and the first reference voltage ref1 is converted into a current with a conversion factor gm.

The 1-bit AD converter 104 includes a series circuit of a comparator 104a, an inverter 104b, and a D flip-flop 104c. The comparator 104a and the D flip-flop 104c operate in synchronization with a clock CLK. In the comparator 104a, a voltage 2nd-int. of the second integration node 102 is compared with a second reference voltage ref2. When 2nd-int. >=ref2, a high-level signal "1" is output. When 2nd-int, <ref2, a low-level signal "0" is output. In the inverter 104, an output signal of the comparator 104a is inverted. In the D flip-flop 104c, an output signal of the inverter 104b input to a data input terminal (D terminal) is sequentially latched in synchronization with the clock. CLK, and is output as a 1-bit digital signal to a data output terminal (Q terminal).

The feedback DA converter 105 includes a constant current circuit 105a, a switch 105b for drawing current from the first integration node 101, and a switch 105s for drawing current from the second integration node 102. In the feedback DA converter 105, current is drawn from the first integration node 101 or the second integration node 102 according to an output of the 1-bit AD converter 104.

A current Ifb of the feedback DA converter 105 is a constant current at all times. As described above, the feedback DA converter 105 switches between the nodes from which to draw current according to an output of the 1-bit AD converter 104, and operates to provide a balanced state in which an average current drawn from each node is balanced with an input current to the node. An output DOUT of the 1-bit AD converter 104 in the balanced state is a correct output (settled output) of the delta-sigma modulator 10.

Here, consider a case where the signal current Isig input to the first integration node 101 is small and the current (Idc-Isig) input to the second integration node 102 is large (FIG. 1 conceptually shows the respective amounts of the currents by the thicknesses of arrows). In this case, in the balanced state, the feedback DA converter 105 draws current from the first integration node 101 with a low frequency, and conversely, draws current from the second integration node 102 with a high frequency.

Figure 2:
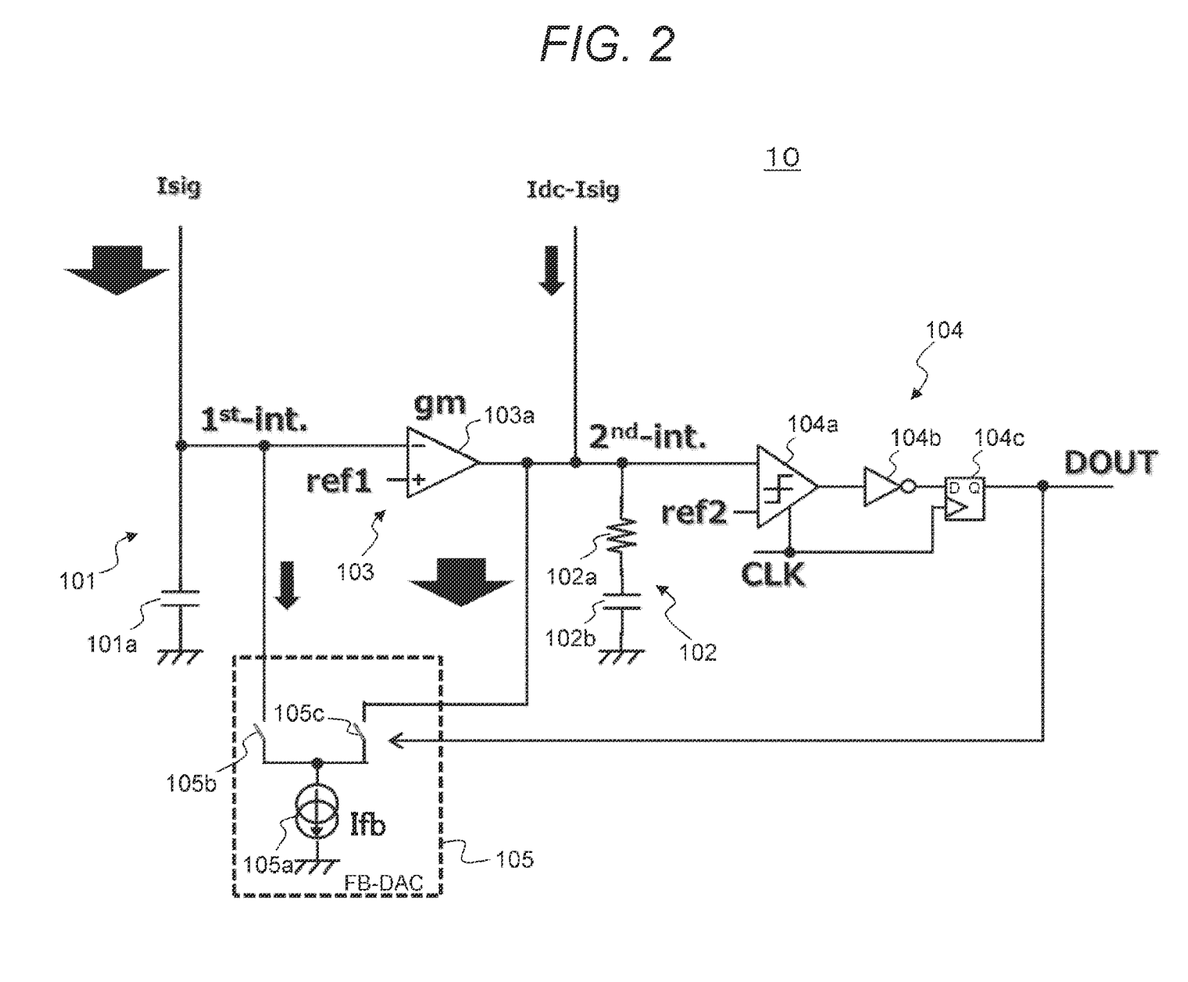
FIG. 2 is a diagram showing a case where a signal current Isig input to a first integration node increases sharply from a balanced state, causing an unbalanced state.

Consider a case where the signal current Isig input to the first integration node 101 increases sharply from the balanced state, causing an unbalanced state. FIG. 2 shows a case in the unbalanced state. In this case, the balanced state breaks down at each of the first integration node 101 and the second integration node 102, and the voltage 1st-int. of the first integration node 101 rises, and the voltage 2nd-int. of the second integration node drops. Further, in this case, if the voltage 1st-int, of the first integration node 101 becomes higher than the first reference voltage ref1, the voltage-to-current converter 103 performs an operation of drawing current from the second integration node 102. Consequently, the voltage 2nd-int. of the second integration node drops further.

The delta-sigma modulator 10 is configured to apply feedback to change from such an unbalanced state into the balanced state again. However, if it is way out of the balanced state, it takes some time to be in the balanced state again, causing a problem that time related to AD conversion time becomes long. The present technology is intended to solve such a problem.

Figure 3:
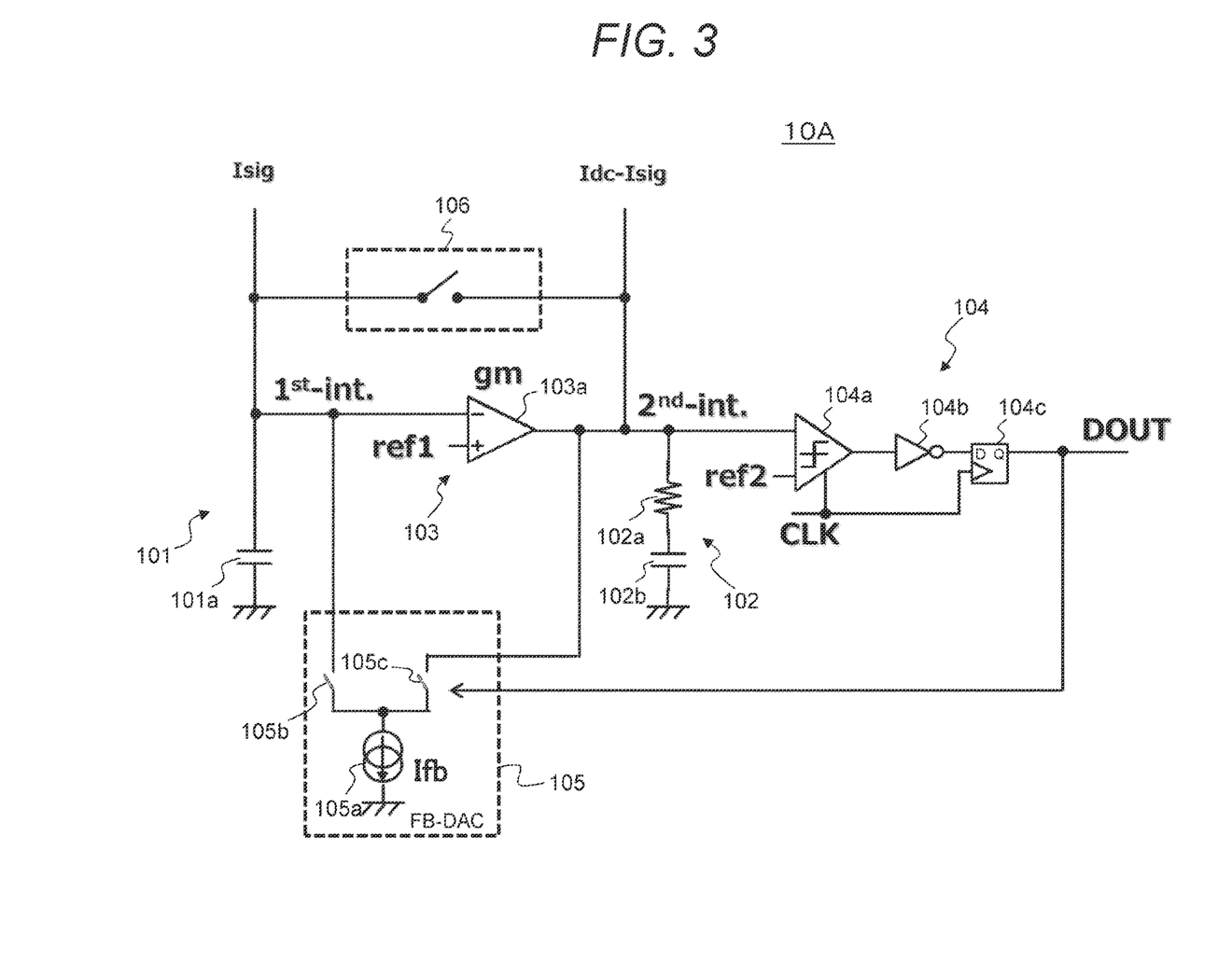
FIG. 3 is a diagram showing a configuration example of a delta-sigma modulator as an embodiment.

FIG. 3 shows a configuration example of a current-input-type delta-sigma modulator 1A as an embodiment. In FIG. 3, parts corresponding to those in FIG. 1 are denoted by the same reference numerals. The delta-sigma modulator 10A includes a first integration node 101, a second integration node 102, a voltage-to-current converter 103, a 1-bit AD converter 104, a feedback DA converter 105, and a short-circuit switch 106. The parts of the first integration node 101, the second integration node 102, the voltage-to-current converter 103, the 1-bit AD converter 104, and the feedback DA converter 105 have configurations and operations similar to those of the delta-sigma modulator 10 shown in FIG. 1, and will not be described in detail.

The delta-sigma modulator 10A has a configuration in which the short-circuit switch 106 is added to the delta-sigma modulator 10 shown in FIG. 1. The short-circuit switch 106 is for short-circuiting the first integration node 101 and the second integration node 102, and is connected at one end to the first integration node 101 and connected at the other end to the second integration node 102.

The short-circuit switch 106 is turned off (disconnected) at normal times, and is turned on (connected) at a timing when the first integration node 101 and the second integration node 102 can be out of the balanced state. Timings at which each integration node can be out of the balanced state may include (1) a timing at which the signal current Isig changes sharply, (2) a timing at which the fixed current Idc becomes unstable, and so on.

Figure 4:
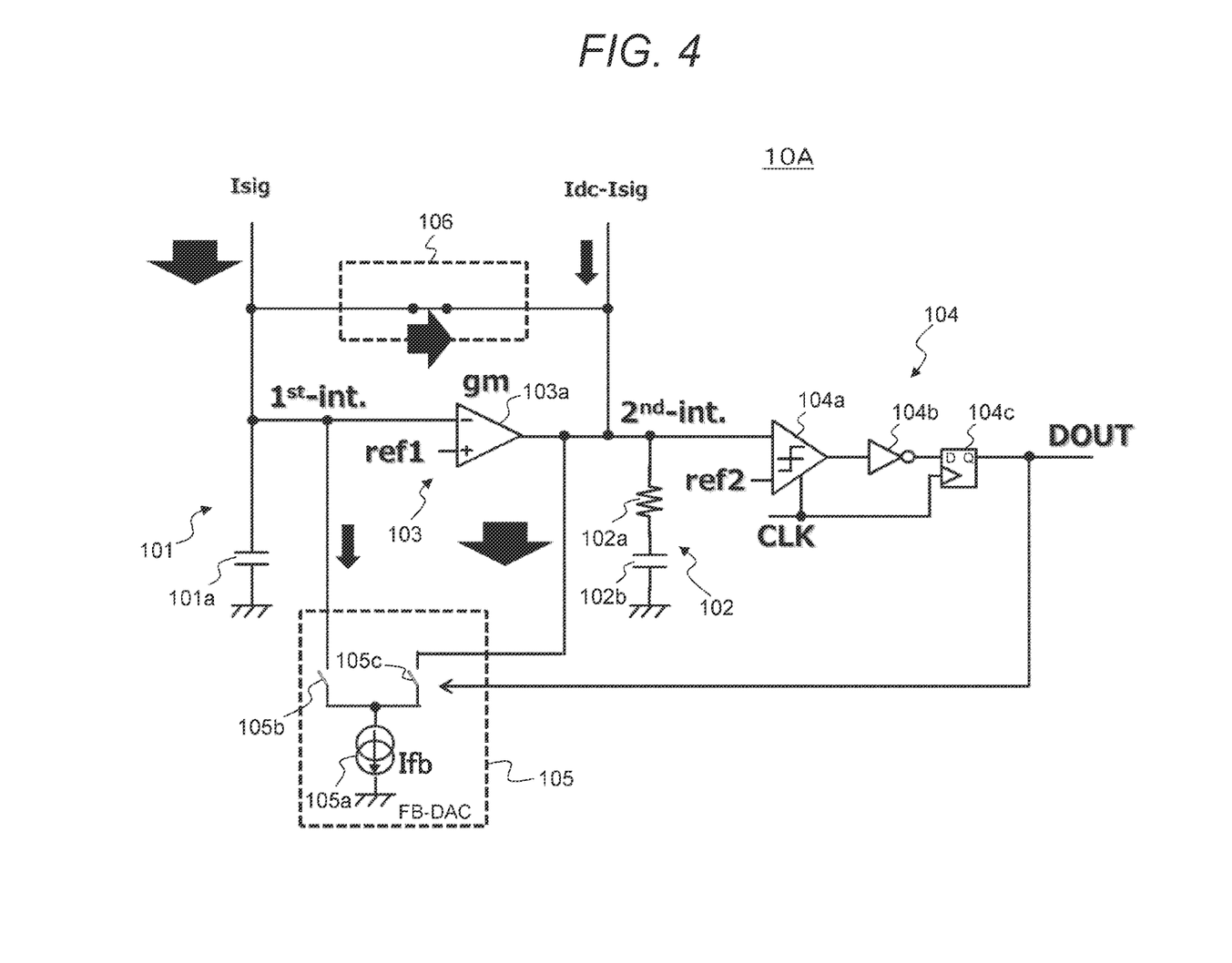
FIG. 4 is a diagram showing an example of a current image in a case where a short-circuit switch is turned on at a timing when the signal current Isig changes sharply.

(1) A case where the short-circuit switch 106 is turned on at a timing when the signal current Isig changes sharply will be described. FIG. 4 shows an example of a current image in that case. Similar to that shown in FIG. 2 described above, this example is an example of a case where the signal current Isig input to the first integration node 101 increases sharply from a state of being small. In this case, current flows from the first integration node 101 side to the second integration node 102 side via the short-circuit switch 106, and the input current to each integration node comes into balance with the average current drawn by the feedback DA converter 105.

Note that although not shown, also in a case where the input signal current Isig decreases sharply from a state of being large, the short-circuit switch 106 is turned on, so that current flows from the second integration node 102 side to the first integration node 101 side via the short-circuit switch 106, and the input current to each integration node comes into balance with the average current drawn by the feedback DA converter 105.

Further, in such a case where the short-circuit switch 106 is turned on, the part of the operational amplifier 103a constituting the voltage-to-current converter 103 constitutes a voltage follower. Thus, its amplifier operation is to bring the voltage 1st-int. of the first integration node 101 and the voltage 1nd-int. of the second integration node 102 close to the first reference voltage ref1. Consequently, even if the signal current Isig changes sharply, it is possible to avoid a significant deviation of the operating point from the balanced state.

For the short-circuit switch 106, when the change of the signal current Isig can be followed to some extent, the short-circuit switch 106 is turned off. As a result, the delta-sigma modulator 10A is returned to a normal operating state.

Figure 5:
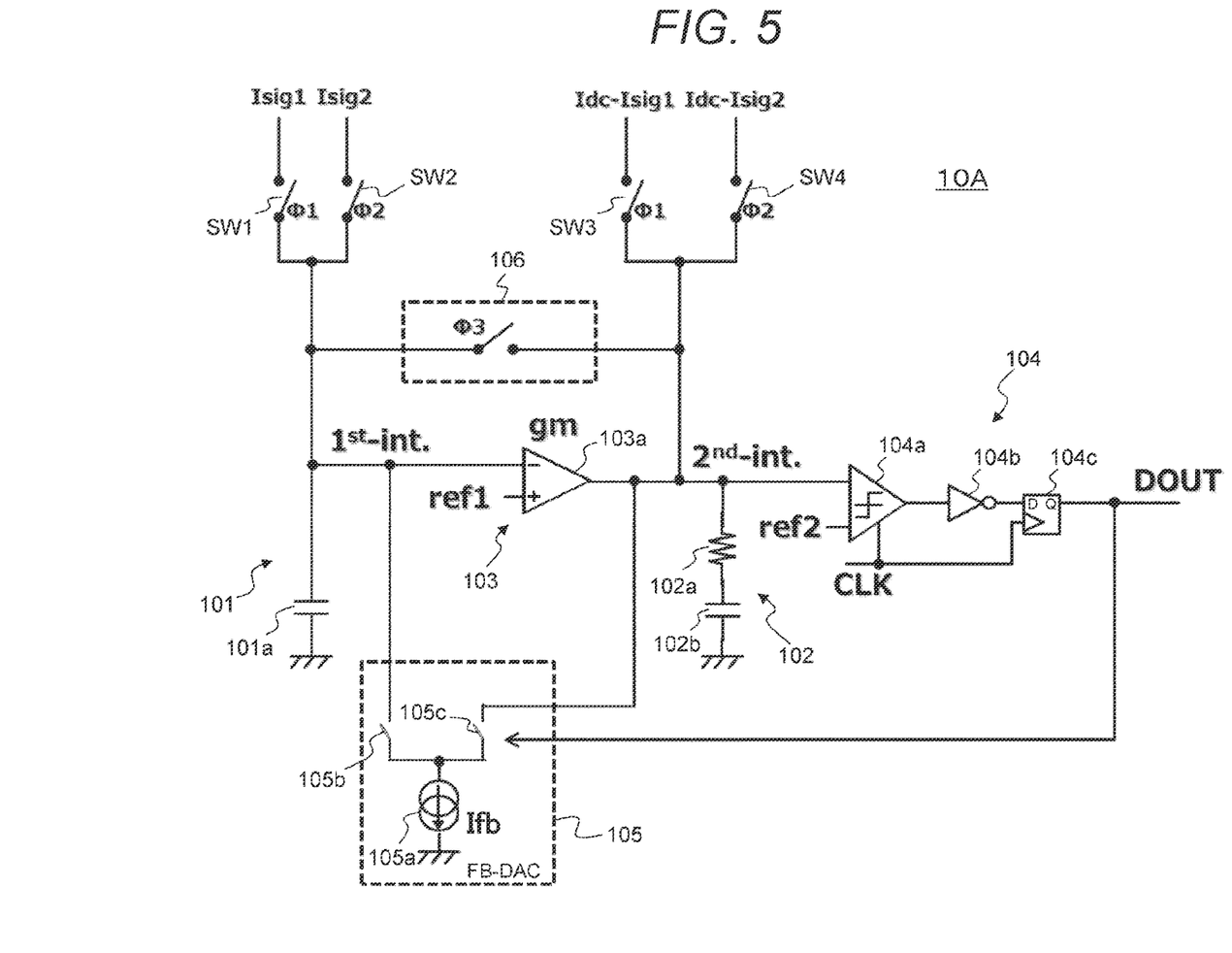
FIG. 5 is a diagram showing an example of a timing at which the signal current Isig changes sharply.

FIG. 5 shows a case where the system of the signal current Isig is changed as an example of the timing at which the signal current Isig changes sharply. The illustrated example shows a case where there are signal currents Isig of two systems, a signal current Isig1 of a first system and a signal current Isig2 of a second system. Although not described in detail, a case where there are three or more systems is much the same.

In a case where the first system is selected by operating switches SW1 to SW4, the signal current Isig1 is input to the first integration node 101, and a current (Idc-Isig1) is input to the second integration node 102. In a case where the second system is selected, the signal current Isig2 is input to the first integration node 101, and a current (Idc-Isig2) is input to the second integration node 102.

In a case where there is a large difference between the signal current Isig1 of the first system and the signal current Isig2 of the second system, the signal current Isig changes sharply when the switches SW1 to SW4 are operated to switch from the first system to the second system, or conversely, from the second system to the first system.

Figure 6:
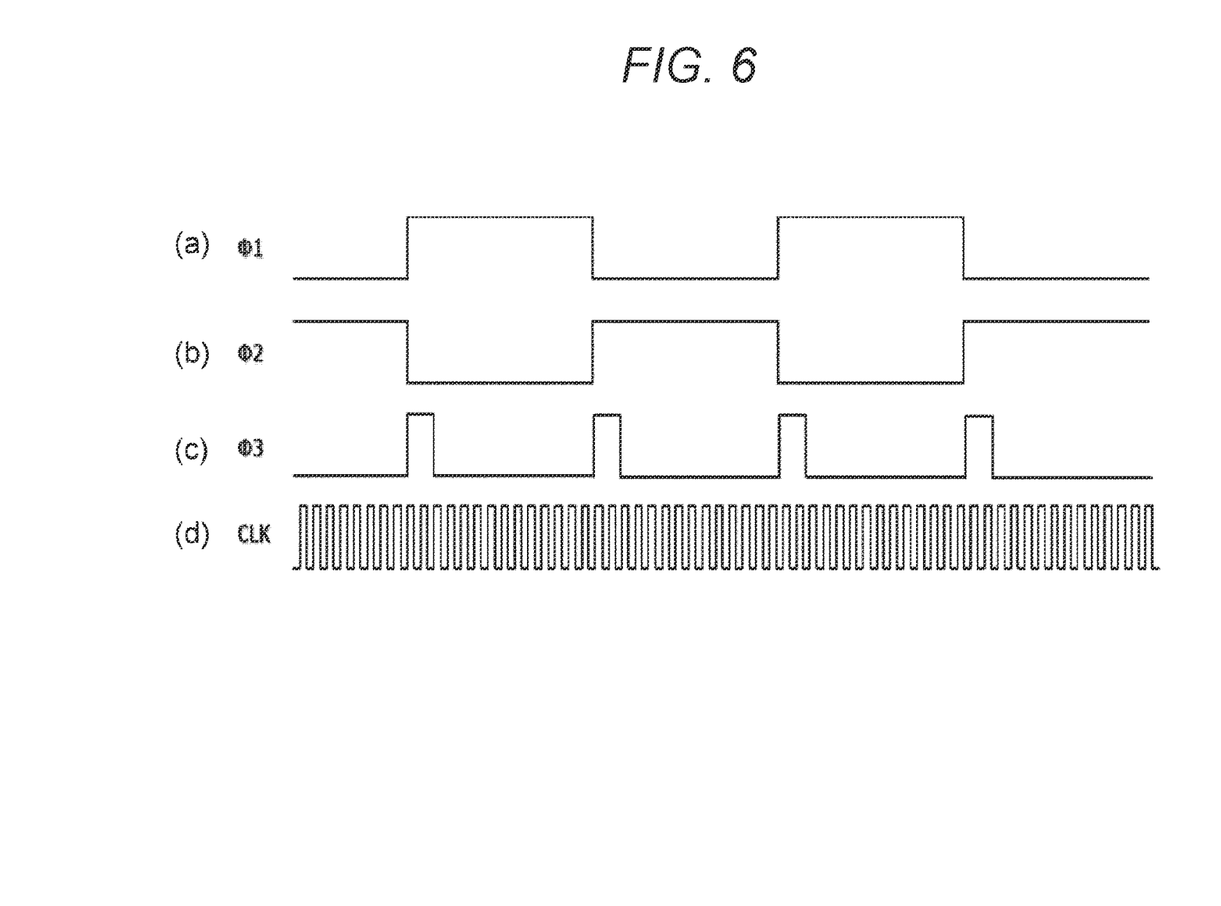
FIG. 6 is a diagram showing an example of control signals for operating respective switches.

FIG. 6 shows an example of control signals for operating the respective switches. FIG. 6(*a*) shows a control signal φ1 to the switches SW1 and SW3 for switching to the first system. FIG. 6(*b*) shows a control signal φ2 to the switches SW2 and SW4 for switching to the first system. The switches SW1 and SW3 are turned on during a period in which the control signal φ1 is at a high level. The switches SW2 and SW3 are turned on during a period in which the control signal φ2 is at a high level.

FIG. 6(*c*) shows a control signal φ3 to the short-circuit switch 106. The short-circuit switch 106 is turned on during a period in which the control signal φ3 is at a high level. The control signal φ3 is set to the high level for a certain period of time at a timing when the control signals φ1 and φ2 that change complementarily change from the high level to the low level, or conversely, from the low level to the high level. The short-circuit switch 106 is turned on during a period in which the control signal φ3 is at the high level. The above-mentioned control signals φ1, φ2, and φ3 are generated in synchronization with the clock CLK. FIG. 6(*d*) shows the clock CLK.

Figure 7:
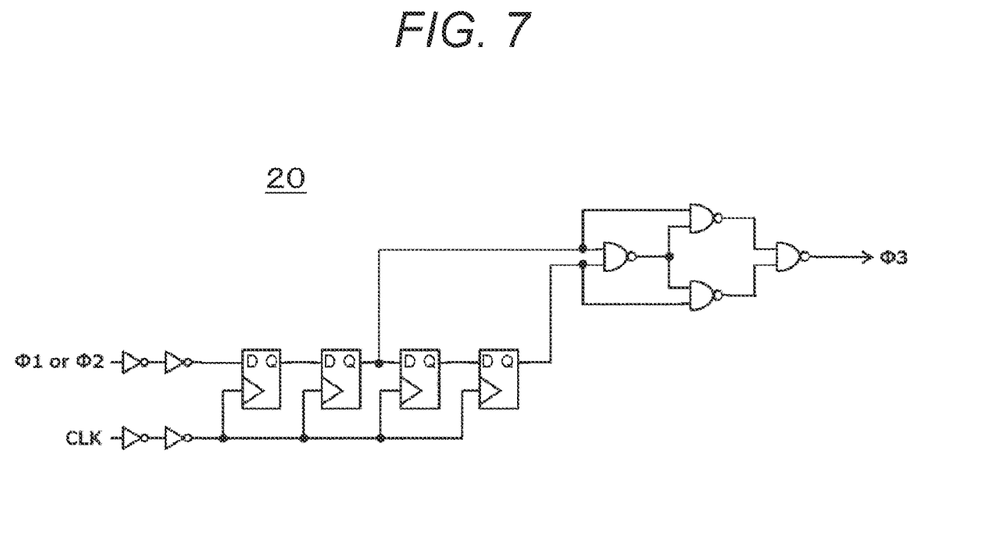
FIG. 7 is a diagram showing an example of a generation circuit that generates a control signal for operating the short-circuit switch.

FIG. 7 shows an example of a generation circuit 20 that generates the control signal φ3 on the basis of the control signal φ1 or the control signal φ2. In the illustrated example, the control signal φ3 is generated at the high level for a period of two clocks from a timing at which the control signal φ1 or φ2 changes from the high level to the low level, or conversely, from the low level to the high level. Note that the method of generating the control signal φ3 is not limited to the case where the generation circuit 20 as shown in FIG. 7 generates it in synchronization with the clock CLK, and may be in any form such as implementing it by a simple control signal if synchronization is not required.

Next, (2) a case where the short-circuit switch 106 is turned on at a timing when the fixed current Idc becomes unstable will be described. Depending on a circuit that generates the fixed current. Idc or the current (Idc-Isig), the fixed current Idc may become unstable at a specific timing.

In this case, the fixed current changes from Idc to Idc'. When the signal current Isig is input to the first integration node 101, a current (Idc'-Isig) is input to the second integration node 102. The sum of them is not the fixed current Idc having a constant value, and continues to be in a state of being larger or smaller than that for a certain period of time.

In this case, in the configuration as shown in FIG. 1 described above, the input current to each integration node becomes out of balance with the average current drawn by the feedback DA converter 105, causing instability. In this embodiment, the short-circuit switch 106 is turned on to be able to keep the balanced state in the delta-sigma modulator 10A.

Figure 8:
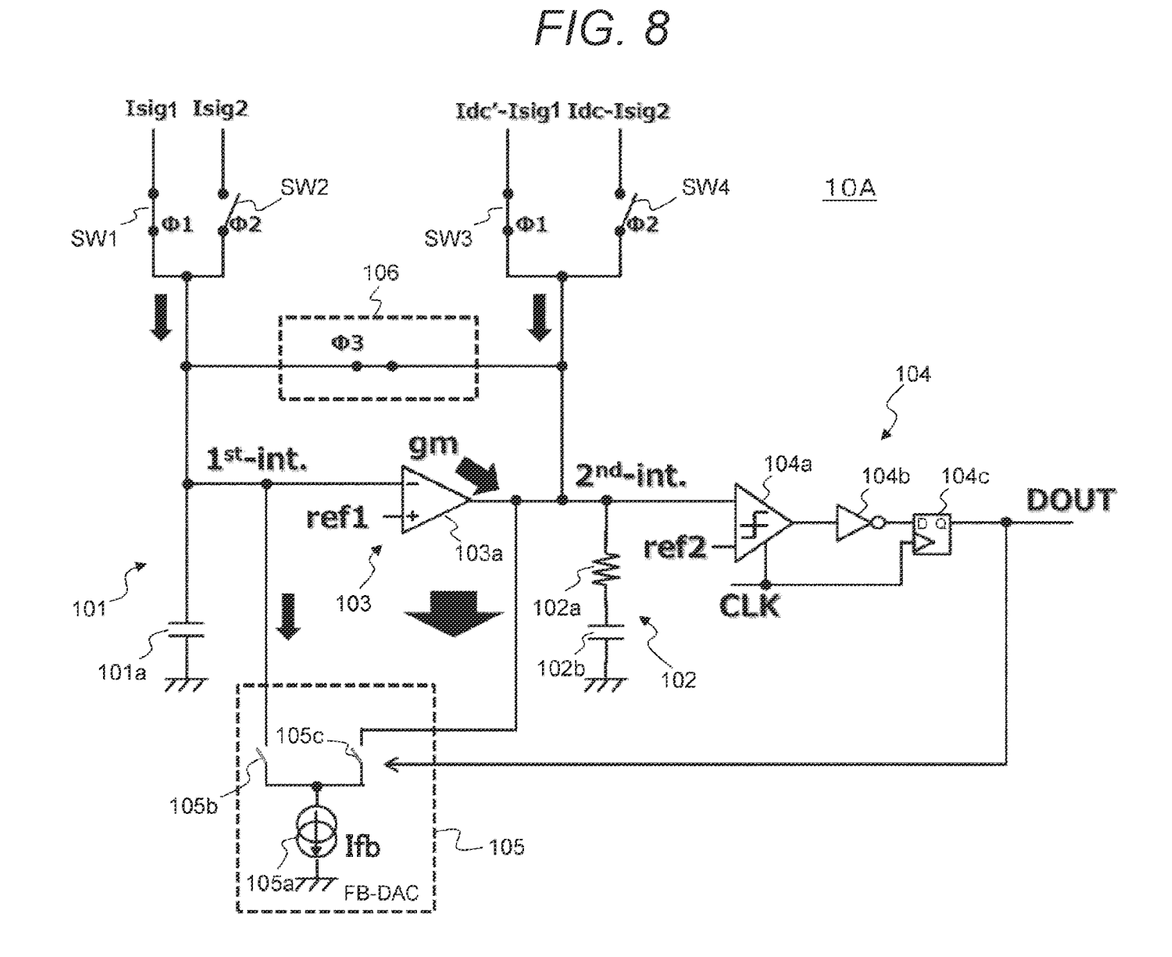
FIG. 8 is a diagram for explaining a case where the short-circuit switch is turned on at a timing when a fixed current Idc becomes unstable.

FIG. 8 shows a case of switching to the first system in which the fixed current changes from Idc to Idc'(Idc'<Idc), and the sum of the currents input to the respective integration nodes becomes smaller than Idc. In this case, the short-circuit switch 106 is turned on as shown in the figure.

Even when the short-circuit switch 106 is turned on in this way, the current (Idc'-Isig) input to the second integration node 102 does not come into balance with the current drawn from the second integration node 102 by the feedback DA converter 105. However, in the case where the short-circuit switch 106 is turned on in this way, the part of the operational amplifier 103*a* constituting the voltage-to-current converter 103 constitutes a voltage follower. Consequently, a shortage of current on the input side of the second integration node 102 is supplied from the voltage-to-current converter 103 for stability. Note that in a case where the fixed current changes from Idc to Idc' (Idc'>Idc) unlike the above, an excess of current on the input side of the second integration node 102 is drawn by the voltage-to-current converter 103 for stability.

Figure 9:
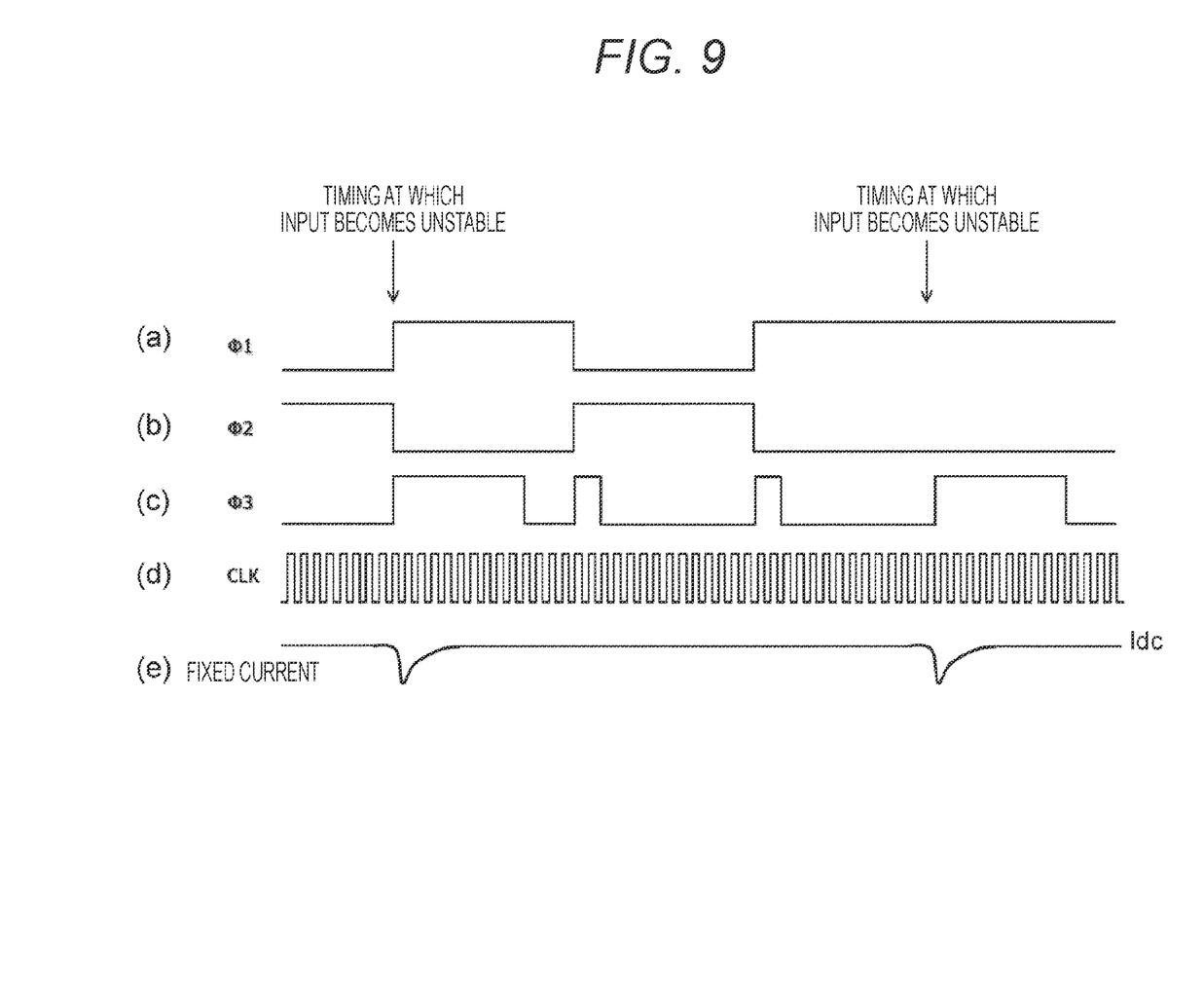
FIG. 9 is a diagram showing an example of control signals for operating respective switches.

FIG. 9 shows an example of control signals for operating the respective switches. FIG. 9(*a*) shows the control signal φ1 to the switches SW1 and SW3 for switching to the first system. FIG. 9(*b*) shows the control signal φ2 to the switches SW2 and SW4 for switching to the first system. The switches SW1 and SW3 are turned on during a period in which the control signal φ1 is at the high level. The switches SW2 and SW4 are turned on during a period in which the control signal φ2 is at the high level.

FIG. 9(*c*) shows the control signal φ3 to the short-circuit switch 106. FIG. 9(*d*) shows the clock CLK. FIG. 9(*e*) shows the fixed current. In this case, the control signal φ3 is set to the high level for a certain period of time at a timing when the input becomes unstable, that is, a timing when the fixed current changes from Idc, and the short-circuit switch 106 is turned on.

Note that the control signal φ3 is set to the high level for a certain period of time at a timing when the control signals φ1 and φ2 change from the high level to the low level, or conversely, from the low level to the high level, but it is not always necessary. Further, in the illustrated example, the period during which the input signal becomes unstable is described in a long image, but the length depends on a circuit that creates the fixed current Idc, the difference current (Idc-Isig), or the like. Furthermore, the method of creating the control signal φ3 is not limited to a particular form.

As described above, the delta-sigma modulator 10A shown in FIG. 3 includes the short-circuit switch 106 for short-circuiting the first integration node 101 and the second integration node 102. Thus, by the short-circuit switch 106 being turned on at a timing when input changes sharply, instability in the internal state can be reduced, so that the settling of output can be speeded up, and the AD conversion time can be shortened. In addition, by the short-circuit switch 106 being turned on at a timing when the fixed current Idc becomes unstable, the internal state can be kept balanced to return to a stable state quickly.

Note that the effects described in the present description are merely illustrative and non-limiting, and additional effects may be included.

2. Modification

Note that in the above-described embodiment, a preferred embodiment of the present disclosure has been described in detail with reference to the accompanying drawings, but the technical scope of the present disclosure is not limited to such an example. It is obvious that a person having ordinary skill in the technical field of the present disclosure can arrive at various alterations or modifications within the scope of the technical ideas described in the claims. These are, of course, considered to belong to the technical scope of the present disclosure.

Furthermore, the present technology can have the following configurations.

(1) A delta-sigma modulator including:
a first integration node to which a signal current is input;
a second integration node to which a difference current between a fixed current and the signal current is input;
a voltage-to-current converter that is connected between the first integration node and the second integration node, and converts a difference voltage between a voltage of the first integration node and a first reference voltage into a current and outputs the current;
a 1-bit AD converter that compares a voltage of the second integration node with a second reference voltage and outputs a 1-bit digital signal;
a feedback DA converter that draws current from the first integration node or the second integration node according to an output of the 1-bit AD converter; and
a short-circuit switch that short-circuits the first integration node and the second integration node.

(2) The delta-sigma modulator according to (1) above, in which
the short-circuit switch is turned on at a timing when the first integration node and the second integration node can be out of a balanced state.

(3) The delta-sigma modulator according to (2) above, in which
the timing is a timing at which the signal current changes sharply.

(4) The delta-sigma modulator according to (3) above, in which
the timing is a timing of change of a system of the signal current.

(5) The delta-sigma modulator according to any one of (2) to (4) above, in which
the timing is a timing at which the fixed current becomes unstable.

(6) A method of driving a delta-sigma modulator including:
a first integration node to which a signal current is input;
a second integration node to which a difference current between a fixed current and the signal current is input;
a voltage-to-current converter that is connected between the first integration node and the second integration node, and converts a difference voltage between a voltage of the first integration node and a first reference voltage into a current and outputs the current;
a 1-bit AD converter that compares a voltage of the second integration node with a second reference voltage and outputs a 1-bit digital signal;
a feedback DA converter that draws current from the first integration node or the second integration node according to an output of the 1-bit AD converter; and
a short-circuit switch that short-circuits the first integration node and the second integration node,
the method including:
turning on the short-circuit switch at a timing when the first integration node and the second integration node can be out of a balanced state, in driving the delta-sigma modulator.

REFERENCE SIGNS LIST

10A Current-input-type delta-sigma modulator
20 Generation circuit
101 First integration node
101a Capacitor
102 Second integration node
102a Resistor
102b Capacitor
103 Voltage-to-current converter
103a Operational amplifier
104 1-bit AD converter
104a Comparator
104b Inverter
104c D flip-flop
105 Feedback DA converter
105a Constant current circuit
105b, 105c Switch
106 Short-circuit switch

The invention claimed is:

1. A delta-sigma modulator comprising:
a first integration node to which a signal current is input;
a second integration node to which a difference current between a fixed current and the signal current is input;
a voltage-to-current converter that is connected between the first integration node and the second integration node, and converts a difference voltage between a voltage of the first integration node and a first reference voltage into a current and outputs the current;
a 1-bit AD converter that compares a voltage of the second integration node with a second reference voltage and outputs a 1-bit digital signal;
a feedback DA converter that draws current from the first integration node or the second integration node according to an output of the 1-bit AD converter; and
a short-circuit switch that short-circuits the first integration node and the second integration node.

2. The delta-sigma modulator according to claim 1, wherein
the short-circuit switch is turned on at a timing when the first integration node and the second integration node can be out of a balanced state.

3. The delta-sigma modulator according to claim 2, wherein
the timing is a timing at which the signal current changes sharply.

4. The delta-sigma modulator according to claim 3, wherein
the timing is a timing of change of a system of the signal current.

5. The delta-sigma modulator according to claim 2, wherein
the timing is a timing at which the fixed current becomes unstable.

6. A method of driving a delta-sigma modulator comprising:
a first integration node to which a signal current is input;
a second integration node to which a difference current between a fixed current and the signal current is input;
a voltage-to-current converter that is connected between the first integration node and the second integration node, and converts a difference voltage between a voltage of the first integration node and a first reference voltage into a current and outputs the current;
a 1-bit AD converter that compares a voltage of the second integration node with a second reference voltage and outputs a 1-bit digital signal;
a feedback DA converter that draws current from the first integration node or the second integration node according to an output of the 1-bit AD converter; and
a short-circuit switch that short-circuits the first integration node and the second integration node,
the method comprising:
turning on the short-circuit switch at a timing when the first integration node and the second integration node can be out of a balanced state, in driving the delta-sigma modulator.

* * * * *